(12) United States Patent
Gao et al.

(10) Patent No.: US 11,251,207 B2
(45) Date of Patent: Feb. 15, 2022

(54) METHOD FOR PREPARING ARRAY SUBSTRATE

(71) Applicant: BOE Technology Group Co., Ltd., Beijing (CN)

(72) Inventors: Yupeng Gao, Beijing (CN); Guangcai Yuan, Beijing (CN); Feng Guan, Beijing (CN); Zhi Wang, Beijing (CN); Jianhua Du, Beijing (CN); Zhaohui Qiang, Beijing (CN); Chao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/846,888

(22) Filed: Apr. 13, 2020

(65) Prior Publication Data

US 2021/0111200 A1 Apr. 15, 2021

(30) Foreign Application Priority Data

Oct. 10, 2019 (CN) .......................... 201910960432.X

(51) Int. Cl.
*H01L 27/00* (2006.01)
*H01L 29/00* (2006.01)
(Continued)

(52) U.S. Cl.
CPC .......... *H01L 27/1285* (2013.01); *H01L 21/84* (2013.01); *H01L 27/1225* (2013.01); *H01L 27/1288* (2013.01); *H01L 29/16* (2013.01); *H01L 29/24* (2013.01); *H01L 29/6675* (2013.01); *H01L 29/66757* (2013.01); *H01L 29/66969* (2013.01); *H01L 29/7869* (2013.01); *H01L 29/78675* (2013.01)

(58) Field of Classification Search
CPC ............ H01L 27/1288; H01L 27/1285; H01L 27/1225; H01L 29/66969; H01L 29/66757; H01L 29/7869; H01L 29/24; H01L 29/6675; H01L 29/16; H01L 29/78675; H01L 29/04; H01L 29/0665; H01L 29/66742; H01L 21/84; H01L 21/32051; H01L 21/3213
See application file for complete search history.

(56) References Cited

U.S. PATENT DOCUMENTS 8,829,511 B2 * 9/2014 Hsieh .................. H01L 27/1225
257/43

* cited by examiner

*Primary Examiner* — Nikolay K Yushin
(74) *Attorney, Agent, or Firm* — Arent Fox LLP; Michael Fainberg

(57) ABSTRACT

The present disclosure discloses a method for preparing an array substrate, an array substrate and a display panel, wherein the method comprises: forming a buffer layer on a substrate in a first region and a second region, wherein the buffer layer has a groove located in the second region; forming a first indium oxide thin film on the buffer layer in the first region; forming a second indium oxide thin film in the groove; performing a reduction process on the second indium oxide thin film to obtain indium particles; forming an amorphous silicon thin film in the groove, and inducing the amorphous silicon of the amorphous silicon thin film to form microcrystalline silicon at a preset temperature by using the indium particles; and removing the indium particles in the microcrystalline silicon to form a microcrystalline silicon semiconductor layer of the microcrystalline silicon thin film transistor.

8 Claims, 8 Drawing Sheets

(51) Int. Cl.
*H01L 21/00* (2006.01)
*H01L 27/12* (2006.01)
*H01L 29/66* (2006.01)
*H01L 29/786* (2006.01)
*H01L 29/24* (2006.01)
*H01L 29/16* (2006.01)
*H01L 21/84* (2006.01)

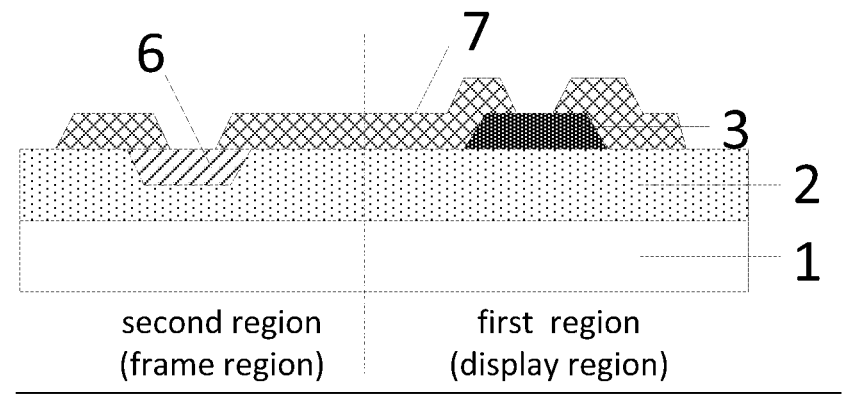
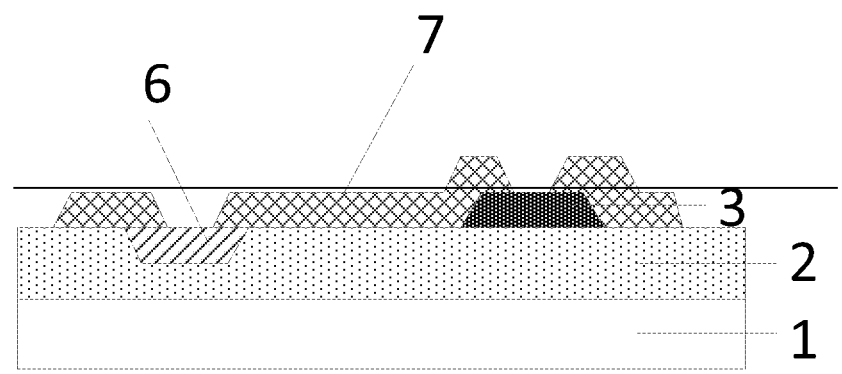
FIG. 2G
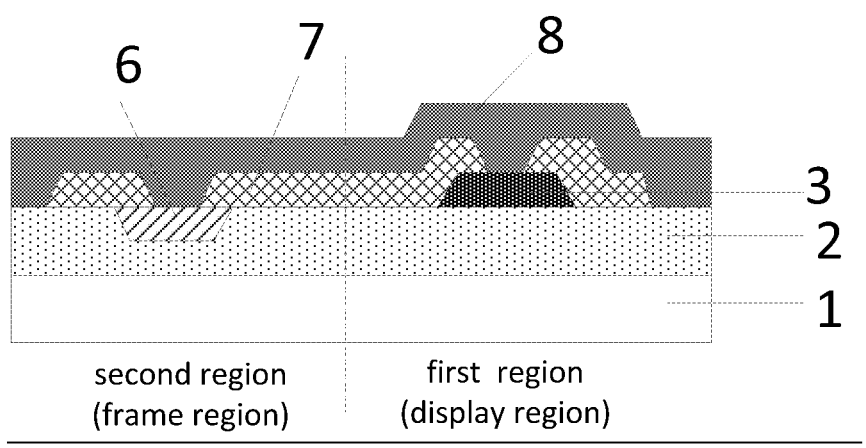

METHOD FOR PREPARING ARRAY SUBSTRATE

The present application claims priority to Chinese Patent Application No. 201910960432.X filed with the Chinese Patent Office on Oct. 10, 2019, which is hereby incorporated by reference in its entirety.

FIELD

The present disclosure relates to the technical field of display, and in particular to a method for preparing an array substrate, an array substrate and a display panel.

BACKGROUND

An array substrate includes a display region and a frame region surrounding the display region, the display region is provided with a pixel driving circuit, and the frame region is provided with a gate driving circuit. In the pixel driving circuit, a required driving current is relatively small, and therefore, the requirement on a migration rate of each transistor in the pixel driving circuit is not high, while the requirement on a migration rate of each transistor in the gate driving circuit is relatively high due to a limited function of the gate driving circuit.

SUMMARY

On the first aspect, an embodiment of the present disclosure provides a method for preparing an array substrate. The array substrate is divided into a first region and a second region, and includes:

a substrate located in the first region and the second region, an oxide thin film transistor located on the substrate in the first region, and a microcrystalline silicon thin film transistor located on the substrate in the second region.

The method includes:

forming a buffer layer on the substrate in the first region and the second region, wherein the buffer layer has a groove located in the second region;

forming a first indium oxide thin film on the buffer layer in the first region; forming a second indium oxide thin film in the groove; wherein the first indium oxide thin film is formed to prepare the oxide thin film transistor, and the second indium oxide thin film is formed to prepare the microcrystalline silicon thin film transistor;

performing a reduction process on the second indium oxide thin film to obtain indium particles;

forming an amorphous silicon thin film in the groove, and inducing the amorphous silicon of the amorphous silicon thin film to form microcrystalline silicon at a preset temperature by using the indium particles; and removing the indium particles in the microcrystalline silicon to form a microcrystalline silicon semiconductor layer of the microcrystal silicon thin film transistor.

In one possible implementation way, in the method for preparing the array substrate, provided by the embodiment of the present disclosure, the forming a first indium oxide thin film on the buffer layer in the first region, and the forming a second indium oxide thin film in the groove, includes:

forming a third indium oxide thin film on one side of the buffer layer away from the substrate in the first region and the second region;

forming a photoresist layer on the third indium oxide thin film;

patterning the photoresist layers by using a halftone mask, and etching the third indium oxide thin film to form the second indium oxide thin film in the groove and the first indium oxide thin film in the first region; and performing an ashing process on the patterned photoresist layer, and retaining a photoresist only on the first indium oxide thin film.

In one possible implementation way, in the method for preparing the array substrate, provided by the embodiment of the present disclosure, the performing the reduction process on the second indium oxide thin film includes:

shielding the first indium oxide thin film by using the photoresist, and performing the reduction process on the second indium oxide thin film via hydrogen plasma.

In one possible implementation way, in the method for preparing the array substrate, provided by the embodiment of the present disclosure, after performing the reduction process on the second indium oxide thin film via hydrogen plasma, the method includes:

removing the photoresist on the first indium oxide thin film.

In one possible implementation way, in the method for preparing the array substrate, provided by the embodiment of the present disclosure, removing the indium particles in the microcrystalline silicon includes:

removing the indium particles of the microcrystalline silicon by a pickling process, wherein an acid used in the pickling process reacts with the indium particles instead of the microcrystalline silicon.

In one possible implementation way, in the method for preparing the array substrate, provided by the embodiment of the present disclosure, after forming the microcrystalline silicon semiconductor layer, the method further includes:

forming a source and drain electrode layer, a gate insulation layer and a gate layer sequentially, at a position of the groove and in the first region to prepare the oxide thin film transistor and the microcrystalline silicon thin film transistor, respectively.

In one possible implementation way, in the method for preparing the array substrate, provided by the embodiment of the present disclosure, each of the first indium oxide thin film, the second indium oxide thin film, and the third indium oxide thin film includes:

indium tin oxide, or indium gallium tin oxide, or indium tin oxide and indium gallium tin oxide.

In one possible implementation way, in the method for preparing the array substrate, provided by the embodiment of the present disclosure, the preset temperature ranges from 0 to 500° C.

On the second aspect, an embodiment of the present disclosure further provides an array substrate, wherein the array substrate is divided into a first region and a second region, and includes:

a substrate located in the first region and the second region, an oxide thin film transistor located on the substrate in the first region, and a microcrystalline silicon thin film transistor located on the substrate in the second region; wherein the oxide thin film transistor and the microcrystalline silicon thin film transistor are formed by using the method for preparing the array substrate, provided by any one of the above-mentioned embodiments.

In one possible implementation way, in the array substrate provided by the embodiment of the present disclosure, the first region is located in a display region of the substrate, and the second region is located in a frame region of the substrate.

On the third aspect, an embodiment of the present disclosure further provides a display panel including the array substrate in the above-mentioned embodiment.

BRIEF DESCRIPTION OF THE DRAWINGS

FIG. 2A-FIG. 2I are corresponding structural schematic diagrams of a preparing process of the array substrate provided by the embodiment of the present disclosure.

DETAILED DESCRIPTION OF THE EMBODIMENTS

In order to meet different requirements of different circuits to transistors, different types of transistors are required to be arranged on the array substrate, the frame region may be provided with a microcrystalline silicon thin film transistor, and the display region may be provided with an oxide thin film transistor. In a related art, when the array substrate with the above-mentioned two types of transistors is fabricated, a type of transistor is fabricated on a corresponding position, then, the other type of transistor is fabricated on the other corresponding position, and thus, a new mask is required to be adopted in each process, thereby increasing the fabrication cost.

Therefore, how to reduce the production cost while meeting the requirements of different regions to the types of the transistors is a technical problem urgent to be solved by those skilled in the art.

For solving the above-mentioned problem existing in the related art, embodiments of the present disclosure provide a method for preparing an array substrate, an array substrate and a display panel. To make the objectives, technical solutions and advantages of the present disclosure clearer, specific implementations of the method for preparing the array substrate, the array substrate and the display panel provided by the embodiments of the present disclosure are described in detail below in combination with accompanying drawings. It should be understood that preferred embodiments described below are merely intended to describe and explain the present disclosure, rather than to limit the present disclosure. In addition, embodiments in the application and features in the embodiments may be mutually combined with each other under the condition of no confliction.

The shape and size of each component in the accompanying drawings are only intended to schematically describe the content of the present disclosure, rather than to reflect a true proportion.

Figure 1:
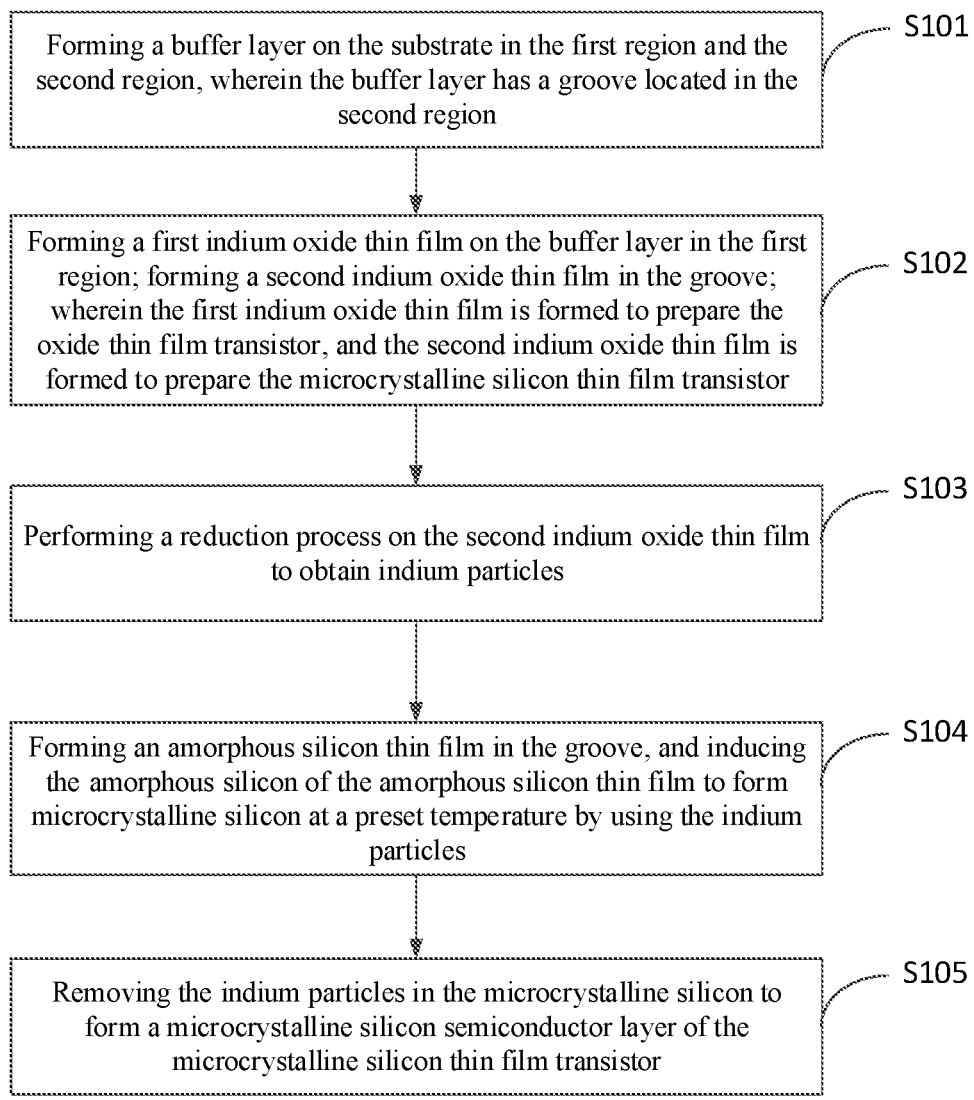
FIG. 1 is a flow diagram of a method for preparing an array substrate provided by an embodiment of the present disclosure.

Optionally, an embodiment of the present disclosure provides a method for preparing an array substrate, wherein the array substrate is divided into a first region and a second region, and includes a substrate located in the first region and the second region, an oxide thin film transistor located on the substrate in the first region, and a microcrystalline silicon thin film transistor located on the substrate in the second region, and the first region is not overlapped with the second region; as shown in FIG. 1, the method includes S101-S105 as follows:

S101, forming a buffer layer on the substrate in the first region and the second region, wherein the buffer layer has a groove located in the second region;

S102, forming a first indium oxide thin film on the buffer layer in the first region; forming a second indium oxide thin film in the groove; wherein the first indium oxide thin film is formed to prepare the oxide thin film transistor, and the second indium oxide thin film is formed to prepare the microcrystalline silicon thin film transistor;

S103, performing a reduction process on the second indium oxide thin film to obtain indium particles, wherein the reduction process and related parameters are as follows:

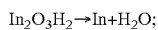

$$In_2O_3H_2 \rightarrow In+H_2O;$$

reduction conditions are as follows: the power ranges from 1 to 100 W; the gas flow ranges from 1 to 1000 sccm; the pressure of a chamber ranges from 10 to 1000 mTorr, the temperature of the chamber ranges from 10 to 500° C., and the reduction time ranges from 0 to 10 min;

S104, forming an amorphous silicon thin film in the groove, and inducing the amorphous silicon of the amorphous silicon thin film to form microcrystalline silicon at a preset temperature by using the indium particles, wherein the deposition parameters of an amorphous transistor may be that the temperature of the substrate ranges from 0 to 200° C.; the pressure of the chamber ranges from 0 to 20 Pa; the gas flow ranges from 10 to 1000 sccm; and the deposition thickness ranges from 10 to 500 nm; and S105, removing the indium particles in the microcrystalline silicon to form a microcrystalline silicon semiconductor layer of the microcrystalline silicon thin film transistor.

In the method for preparing the array substrate, provided by the embodiment of the present disclosure, induced metal indium of the semiconductor layer of the microcrystalline silicon thin film transistor is obtained by reducing the indium oxide thin film formed on a semiconductor layer for fabricating the oxide thin film transistor, the microcrystalline silicon semiconductor layer is formed in a way that amorphous silicon is induced by metal indium, and after the microcrystalline silicon semiconductor layer is formed, film layers, with same functions, of the two types of transistors may be fabricated via a same mask, so that the use amount of masks is greatly reduced. Meanwhile, the film layers in the two types of transistors may be fabricated via the same mask, so that the requirement of a process to a distance between the two types of transistors is reduced, and the resolution ratio may be increased.

Optionally, in the fabrication method of the array substrate, provided by the embodiment of the present disclosure, forming a first indium oxide thin film on the buffer layer in the first region, and forming a second indium oxide thin film in the groove, includes:

a third indium oxide thin films are formed on one side of the buffer layer away from the substrate in the first region and the second region;

photoresist layers are formed on the third indium oxide thin films;

the photoresist layers are patterned by using a halftone mask, and the third indium oxide thin films are etched to form the second indium oxide thin film in the groove and the first indium oxide thin film in the first region; and the patterned photoresist layer is subjected to ashing process, and a photoresist is retained only on the first indium oxide thin film located in the first region.

In the method for preparing the array substrate, provided by the embodiment of the present disclosure, the photoresist located in the first region may be retained by patterning the photoresist via the halftone mask, the photoresist covers the oxide thin film in the first region, and the oxide thin film is the semiconductor layer of the oxide thin film transistor. Since the oxide thin film in the groove is required to be subjected to reduction later to obtain the induced metal indium of the microcrystalline silicon semiconductor layer, retaining the photoresist located in the first region to cover the oxide thin film in the first region can make that, when the oxide thin film in the groove is subjected to reduction, the mask is not required to be arranged, and therefore, the use amount of masks is further reduced.

Optionally, in the method for preparing the array substrate, provided by the embodiment of the present disclosure, performing the reduction process on the second indium oxide thin film includes:

the first indium oxide thin film is shielded by using the photoresist, and the second indium oxide thin film is subjected to reduction process via hydrogen plasma.

It should be noted that the oxide thin film is subjected to reduction in a way of hydrogen plasma treatment in the above-mentioned embodiment, and of course, the oxide thin film may also be subjected to reduction in other ways, which is not defined herein.

Optionally, in the method for preparing the array substrate, provided by the embodiment of the present disclosure, after the second indium oxide thin film is subjected to reduction process via the hydrogen plasma, the method includes:

the photoresist covering the first indium oxide thin film is removed.

In the method for preparing the array substrate, provided by the embodiment of the present disclosure, the phenomenon that the oxide thin film in the first region is subjected to reduction to affect the performance of the oxide thin film transistor is avoided by covering the photoresist on the oxide thin film in the first region in a process of reducing the oxide thin film in the groove. However, after the oxide thin film in the groove is subjected to reduction to obtain the indium particles, the subsequent steps are required to be patterned by virtue of the mask, and therefore, the photoresist in the first region may be removed after the reduction step, of course, the photoresist in the first region may also be removed after the microcrystalline silicon semiconductor layer is formed, and the removal time may be selected according to an actual demand, which is not defined herein.

Optionally, in the method for preparing the array substrate, provided by the embodiment of the present disclosure, removing the indium particles in the microcrystalline silicon includes:

the indium particles of the microcrystalline silicon are removed by using a pickling process, wherein an acid used in the pickling process reacts with the indium particles instead of the microcrystalline silicon.

In the method for preparing the array substrate, provided by the embodiment of the present disclosure, the metal indium may move towards the surface of microcrystalline silicon in a process that the metal indium may induce the amorphous silicon to form the microcrystalline silicon, so that the indium particles may be removed by using the pickling process, wherein when including other metals, the oxide thin film is also subjected to reduction during reduction, but the indium particles play a main induction role, and in the pickling process in the step, not only may the metal indium particles be removed, but also other metal particles may be removed.

It should be noted that the acid used in the step reacts with metal particles instead of silicon, for example, the acid may be dilute hydrochloric acid or dilute sulfuric acid, etc. instead of a silicon-corrosive acid such as hydrofluoric acid.

Optionally, in the method for preparing the array substrate, provided by the embodiment of the present disclosure, after the microcrystalline silicon semiconductor layer is formed, the method further includes:

a source and drain electrode layer, a gate insulation layer and a gate layer are sequentially formed at a position of the groove and in the first region to prepare the oxide thin film transistor and the microcrystalline silicon thin film transistor, respectively.

In the method for preparing the array substrate, provided by the embodiment of the present disclosure, after the semiconductor layers of both the oxide thin film transistor and the microcrystalline silicon thin film transistor are formed, the same functional layers may be fabricated by using the same mask in a subsequent fabrication process of the functional layers, for example, the source and drain electrode layers of both the oxide thin film transistor and the microcrystalline silicon thin film transistor may be fabricated via the same mask, the gate insulation layers of the oxide thin film transistor and the microcrystalline silicon thin film transistor may be fabricated via the same mask, the gate layers of the oxide thin film transistor and the microcrystalline silicon thin film transistor may also be fabricated via the same mask, and compared with the use amount of masks for respectively fabricating the functional layers of the two types of thin film transistors in the related art, the use amount of masks in the fabrication method is greatly reduced.

Optionally, in the method for preparing the array substrate, provided by the embodiment of the present disclosure, each of the first indium oxide thin film, the second indium oxide thin film, and the third indium oxide thin film includes indium tin oxide, or indium gallium tin oxide, or indium tin oxide and indium gallium tin oxide.

Optionally, in the method for preparing the array substrate, provided by the embodiment of the present disclosure, the preset temperature ranges from 0 to 500° C.

Figure 2A:
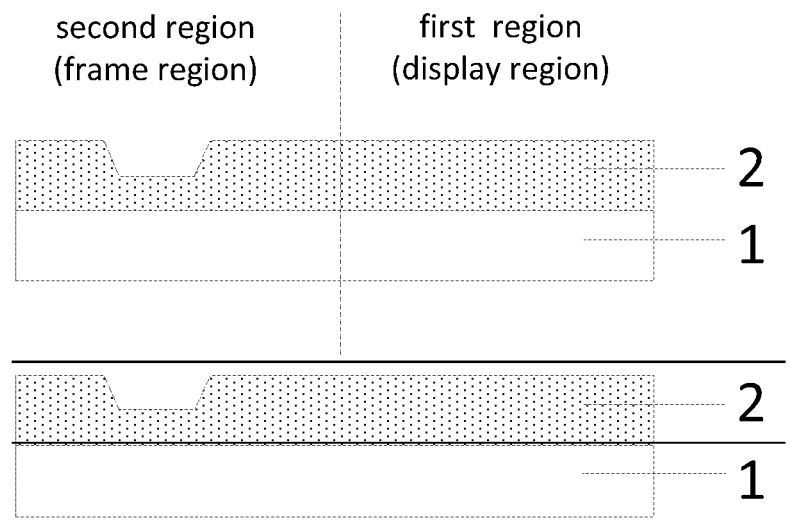
Figure 2B:
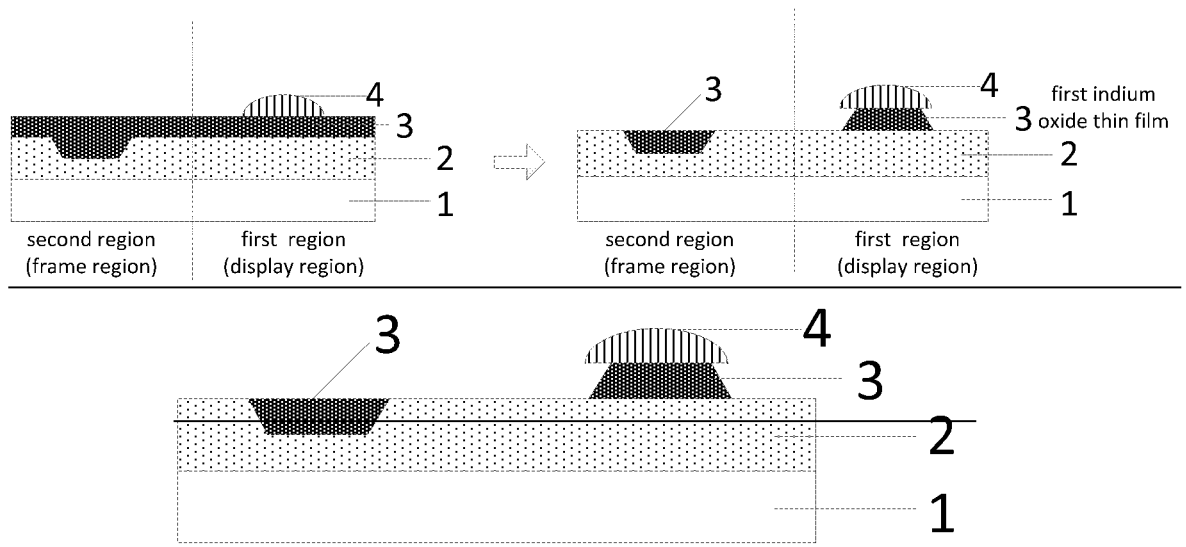
Figure 2C:
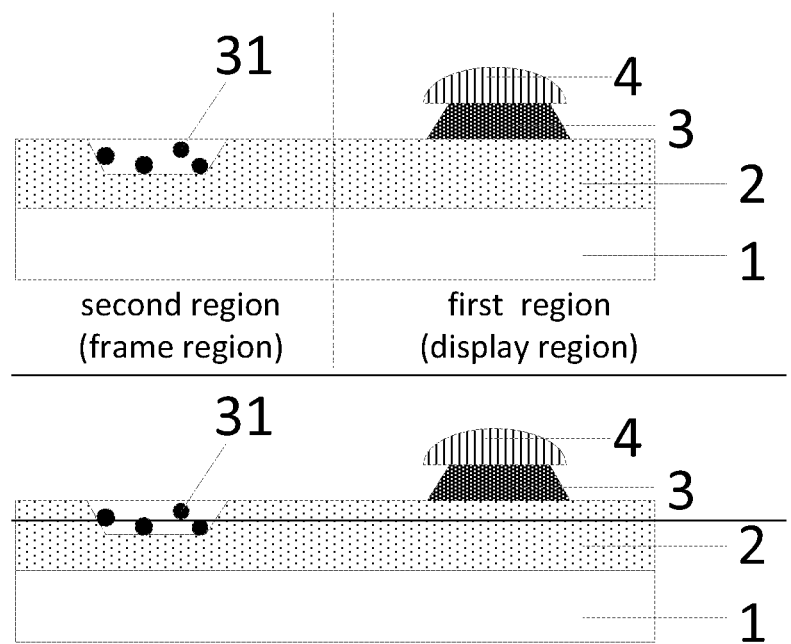
Figure 2D:
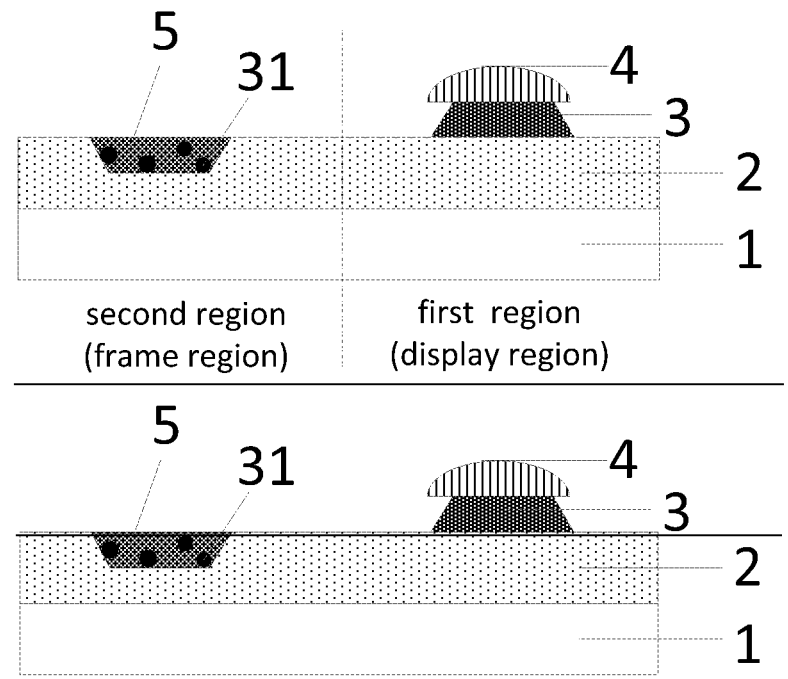
Figure 2E:
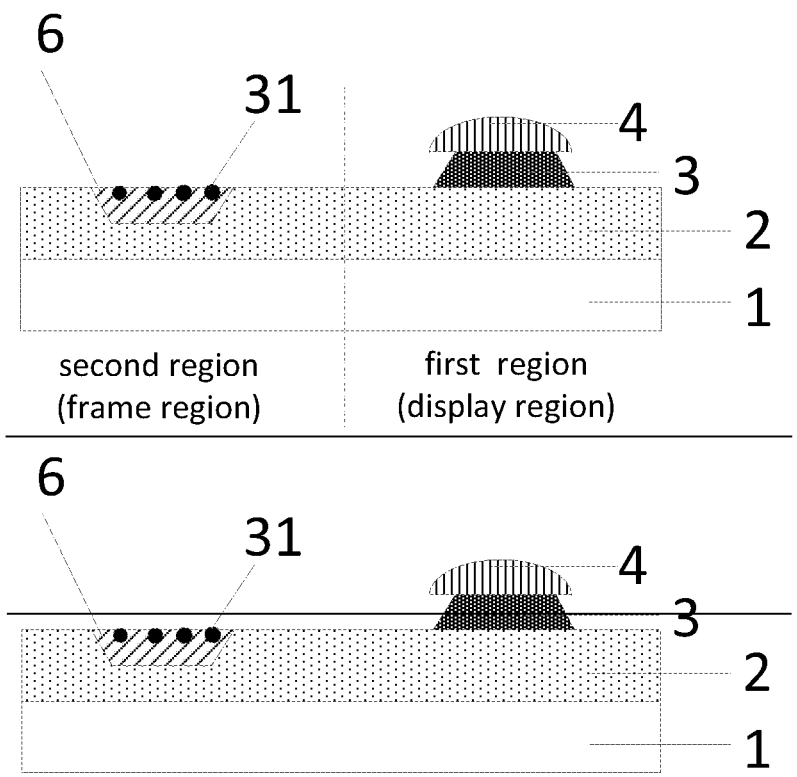
Figure 2F:
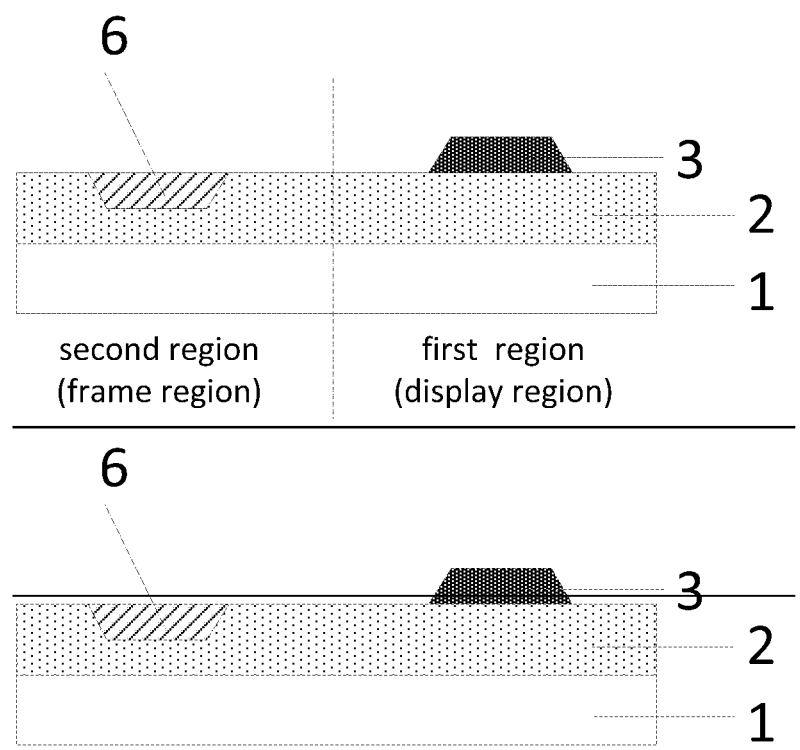
Figure 2H:
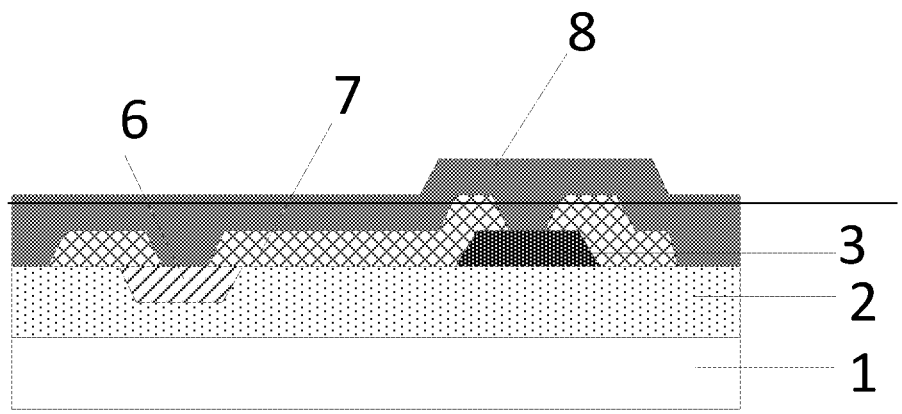
Figure 2I:
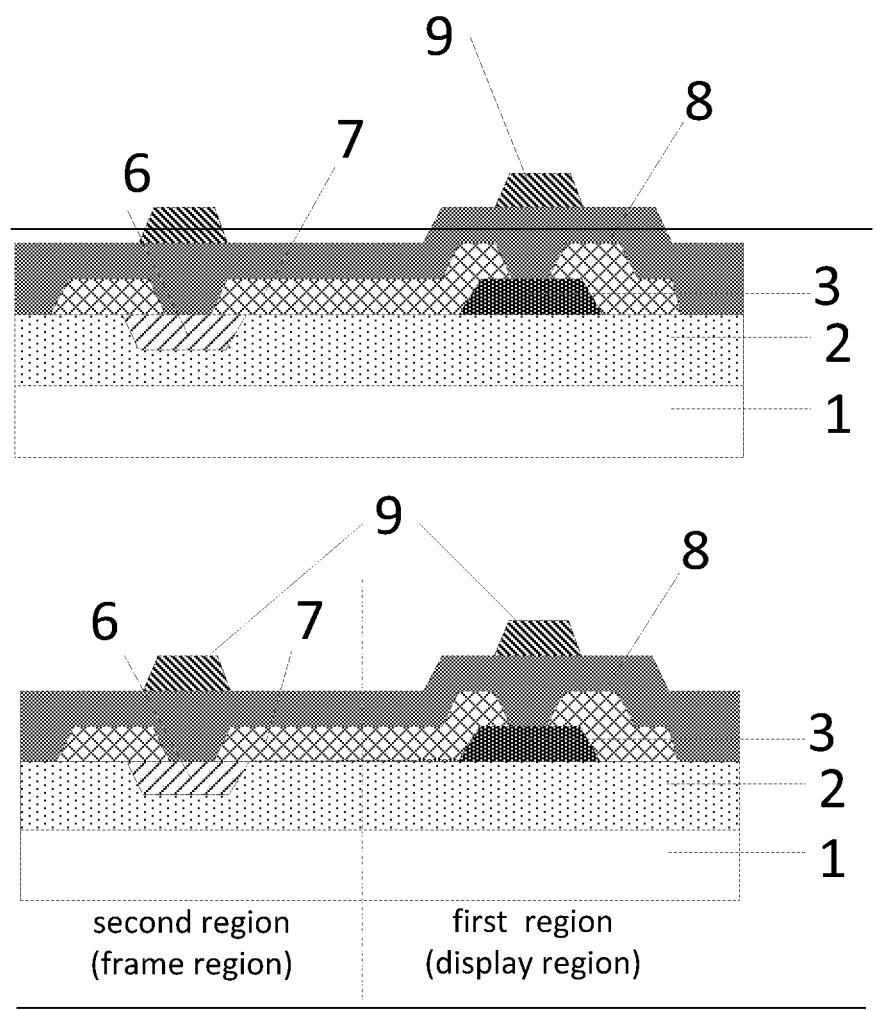

The method for preparing the array substrate is described below in combination with accompanying drawings FIGS. 2A-2I:

as shown in FIG. 2A, a substrate 1, a buffer layer 2 is formed on the substrate 1; the buffer layer 2 is etched on a second region of the array substrate to be prepared via a first mask to form a groove located in the buffer layer 2;

as shown in FIG. 2B, an indium oxide thin film 3 is formed on one side of the buffer layer 2 away from the substrate 1, the indium oxide thin film 3 is patterned via a second mask (a halftone mask) to retain the oxide thin film 3 in the groove, and meanwhile, to retain the oxide thin film 3 covered by a photoresist 4 in a first region of the array substrate to be prepared;

as shown in FIG. 2C, the oxide thin film 3 in the groove is subjected to reduction via hydrogen plasma to obtain metal indium particles 31;

as shown in FIG. 2D, an amorphous silicon thin film 5 is deposited and is patterned via a third mask, the amorphous silicon thin film 5 in a region where the groove is located is retained, and an amorphous silicon and metal indium mixture is formed in the groove;

as shown in FIG. 2E, the amorphous silicon is induced by using the metal indium particles 31 at 350° C. to form a microcrystalline silicon semiconductor layer 6, and meanwhile, the metal indium particles 31 are located on the surface of the microcrystalline silicon semiconductor layer 6;

as shown in FIG. 2F, the metal indium particles 31 in the region where the groove is located are removed in a pickling way via a fourth mask to form the microcrystalline silicon semiconductor layer, and a photoresist in a region where an oxide thin film transistor is located is removed;

as shown in FIG. 2G source and drain electrode layers 7 are respectively and correspondingly formed on the microcrystalline silicon semiconductor layer 6 and the oxide thin film 3 and are patterned via a fifth mask, wherein FIG. 2G shows a connection relationship existing between two types of source and drain electrodes, is a schematic structural diagram and is intended to show that a connection relationship exists between the microcrystalline silicon thin film transistor and the oxide thin film transistor;

as shown in FIG. 2H, gate insulation layers 8 are formed on the sides of the source and drain electrode layers 7 away from the substrate 1; and as shown in FIG. 2I, gate layers 9 are formed on the gate insulation layers 8 via a sixth mask, which are corresponding to the oxide thin film transistor and the microcrystalline silicon thin film transistor respectively.

Figure 3:
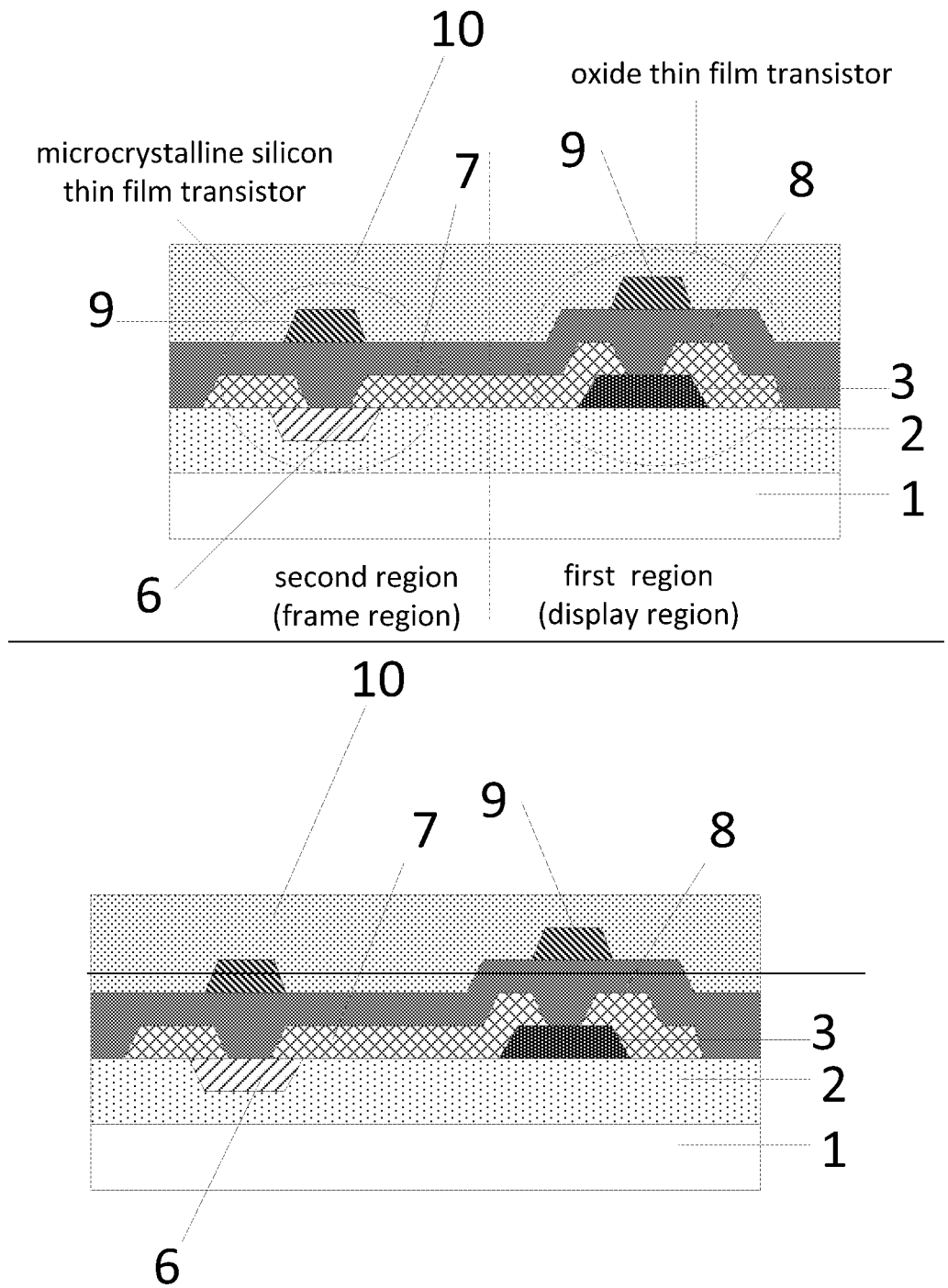
FIG. 3 is a structural schematic diagram of an array substrate provided by an embodiment of the present disclosure.

Based on the same inventive concept, as shown in FIG. 3, an embodiment of the present disclosure further provides an array substrate divided into a first region and a second region. The array substrate includes a substrate 1 located in the first region and the second region, an oxide thin film transistor located on the substrate 1 in the first region, and a microcrystalline silicon thin film transistor located on the substrate 1 in the second region; and the oxide thin film transistor and the microcrystalline silicon thin film transistor are formed by using the method for preparing the array substrate, provided by the above-mentioned embodiment.

Optionally, in the array substrate provided by the embodiment of the present disclosure, the first region may be located in a display region of the substrate, and the second region may be located in a frame region of the substrate.

In addition to each film layer provided by the above-mentioned embodiment, as shown in FIG. 3, the array substrate may further include a planarization layer 10 located at the sides of the gate layers 9 away from the substrate 1, etc.

It should be noted that the array substrate is fabricated by adopting the above-mentioned fabrication method of the array substrate, so that the array substrate has the advantages of the fabrication method of the array substrate and may be implemented by reference to the embodiment of the fabrication method of the array substrate, which is not described herein.

Based on the same inventive concept, an embodiment of the present disclosure further provides a display panel including the array substrate provided by the above-mentioned embodiment and a packaging cover plate covering the array substrate.

The display panel has the advantages of the array substrate and may be implemented by reference to the embodiment of the array substrate, which is not described herein.

The embodiments of the present disclosure provide the method for preparing the array substrate, the array substrate and the display panel. By using the method for preparing the array substrate, induced metal indium of the semiconductor layer of the microcrystalline silicon thin film transistor is obtained by reducing the indium oxide thin film formed on the semiconductor layer for fabricating the oxide thin film transistor, the microcrystalline silicon semiconductor layer is formed in a way that amorphous silicon is induced by metal indium, and after the microcrystalline silicon semiconductor layer is formed, film layers, with same functions, of the two types of transistors may be fabricated via the same mask, so that the use amount of masks is greatly reduced.

Obviously, those skilled in the art can make various alterations and variations on the present disclosure without departing from the spirit and scope of the present disclosure. In this way, if the alterations and variations of the present disclosure fall within the scopes of the claims and equivalent technologies of the claims, the present disclosure is also intended to include the alterations and variations.

What is claimed is:

1. A method for preparing an array substrate, wherein the array substrate is divided into a first region and a second region, and comprises:
   a substrate located in the first region and the second region,
   an oxide thin film transistor located on the substrate in the first region, and
   a microcrystalline silicon thin film transistor located on the substrate in the second region; and
   the method comprises:
      forming a buffer layer on the substrate in the first region and the second region, wherein the buffer layer has a groove located in the second region;
      forming a first indium oxide thin film on the buffer layer in the first region; forming a second indium oxide thin film in the groove; wherein the first indium oxide thin film is formed to prepare the oxide thin film transistor, and the second indium oxide thin film is formed to prepare the microcrystalline silicon thin film transistor;
      performing a reduction process on the second indium oxide thin film to obtain indium particles;
      forming an amorphous silicon thin film in the groove, and inducing the amorphous silicon of the amorphous silicon thin film to form microcrystalline silicon at a preset temperature by using the indium particles; and
      removing the indium particles in the microcrystalline silicon to form a microcrystalline silicon semiconductor layer of the microcrystalline silicon thin film transistor.

2. The method for preparing the array substrate of claim 1, wherein the forming a first indium oxide thin film on the buffer layer in the first region, and the forming a second indium oxide thin film in the groove, comprises:
   forming a third indium oxide thin film on one side of the buffer layer away from the substrate in the first region and the second region;
   forming a photoresist layer on the third indium oxide thin film;
   patterning the photoresist layer by using a halftone mask, and etching the third indium oxide thin film to form the second indium oxide thin film in the groove and the first indium oxide thin film in the first region; and
   performing an ashing process on the patterned photoresist layer, and retaining a photoresist only on the first indium oxide thin film.

3. The method for preparing the array substrate of claim 2, wherein the performing the reduction process on the second indium oxide thin film comprises:

shielding the first indium oxide thin film by using the photoresist, and performing the reduction process on the second indium oxide thin film via hydrogen plasma.

4. The method for preparing the array substrate of claim 2, wherein after performing the reduction process on the second indium oxide thin film via hydrogen plasma, the method further comprises:

removing the photoresist on the first indium oxide thin film.

5. The method for preparing the array substrate of claim 1, wherein removing the indium particles in the microcrystalline silicon comprises:

removing the indium particles of the microcrystalline silicon by a pickling process, wherein an acid used in the pickling process reacts with the indium particles instead of the microcrystalline silicon.

6. The method for preparing the array substrate of claim 1, wherein after forming the microcrystalline silicon semiconductor layer, the method further comprises:

forming a source and drain electrode layer, a gate insulation layer and a gate layer sequentially, at a position of the groove and in the first region to prepare the oxide thin film transistor and the microcrystalline silicon thin film transistor, respectively.

7. The method for preparing the array substrate of claim 1, wherein each of the first indium oxide thin film, the second indium oxide thin film, and the third indium oxide thin film comprises:

indium tin oxide, or indium gallium tin oxide, or indium tin oxide and indium gallium tin oxide.

8. The method for preparing the array substrate of claim 1, wherein the preset temperature ranges from 0 to 500° C.

* * * * *